United States Patent [19]
Polkinghorne

[11] Patent Number: 5,784,890
[45] Date of Patent: Jul. 28, 1998

[54] COMPACT THERMOELECTRIC REFRIGERATION DRIVE ASSEMBLY

[76] Inventor: John D. Polkinghorne, 66 Fairwood Place East, Burlington, Ontario, Canada, L7T 2B6

[21] Appl. No.: 657,160

[22] Filed: Jun. 3, 1996

[51] Int. Cl.⁶ ............................................. F25B 21/02
[52] U.S. Cl. .................................... 62/3.7; 165/104.12
[58] Field of Search .............................. 62/3.2, 3.3, 3.6, 62/37; 165/104.12

[56] References Cited

U.S. PATENT DOCUMENTS

| | | | |
|---|---|---|---|
| 3,236,056 | 2/1966 | Phillips et al. | 62/3 |
| 3,240,261 | 3/1966 | Morales | 165/2 |
| 4,281,516 | 8/1981 | Berthet et al. | 62/3 |
| 4,328,676 | 5/1982 | Reed | 62/3 |
| 4,576,009 | 3/1986 | Ogushi et al. | 62/3 |
| 4,930,317 | 6/1990 | Klein | 63/3.3 |
| 4,962,761 | 10/1990 | Golden | 128/400 |
| 5,061,630 | 10/1991 | Knopf et al. | 435/290 |
| 5,092,129 | 3/1992 | Bayes et al. | 62/3.3 |
| 5,154,661 | 10/1992 | Higgins | 62/3.3 |
| 5,269,146 | 12/1993 | Kerner | 62/3.6 |
| 5,409,547 | 4/1995 | Watanabe et al. | 136/204 |
| 5,431,021 | 7/1995 | Gwilliam et al. | 62/3.7 |
| 5,483,799 | 1/1996 | Dalto | 62/3.7 |
| 5,544,487 | 8/1996 | Attey et al. | 62/3.7 |

*Primary Examiner*—William Doerrler
*Attorney, Agent, or Firm*—Herzog, Crebs & McGhee, LLP

[57] ABSTRACT

A compact thermoelectric refrigeration drive assembly comprises at least one thermoelectric heat transfer device (Peltier Effect device) whose active surfaces are in contact with a respective one of a collector member and a transfer member. When operating, a dc current is applied to the heat transfer device to transfer heat from the collector member to the transfer member. This results in the collector member, which is intended to be located in an insulated chamber, being cooled and the transfer member, which is spaced away from the collector member, being heated. Waste heat is removed from the transfer member via a closed looped fluid cooling system, the transfer member forming at least a portion of one side of a vessel for the cooling fluid and thereby transferring heat to the fluid. The construction and design of the assembly advantageously results in a compact refrigerator drive assembly which can be employed in a variety of environments.

15 Claims, 5 Drawing Sheets

COMPACT THERMOELECTRIC REFRIGERATION DRIVE ASSEMBLY

FIELD OF THE INVENTION

The present invention relates to thermoelectric refrigeration systems. More specifically, the present invention relates to a thermoelectric refrigeration drive which is constructed to provide a substantially compact assembly.

BACKGROUND OF THE INVENTION

Refrigeration systems which employ thermoelectric devices, commonly referred to as Peltier Effect devices or simply Peltier devices, are well known. The Peltier device in such uses is generally in the form of a planar device and has a dc voltage applied across two opposed surfaces of the device, referred to herein as the active surfaces. The dc current flow results in the transfer of heat from one active surface of the device to the other. By thermally connecting the cooled active surface of the Peltier device to the interior of a refrigerated chamber, the chamber can be cooled. Waste heat must be removed from the other active side of the Peltier device and this can be accomplished by a variety of means including forced air cooling, etc.

Examples of refrigerators employing thermoelectric refrigeration drive units are shown in U.S. Pat. No. 5,269,146 to Kerner; U.S. Pat. No. 4,328,676 to Reed; U.S. Pat. No. 4,576,009 to Ogushi et al.; U.S. Pat. No. 5,061,630 to Knop et al.; and U.S. Pat. No. 5,483,799 to Dalto, the contents of each of which are incorporated herein by reference.

However, problems exist with prior art thermoelectric refrigeration systems in that their drive units are typically relatively large and/or necessitate a specially constructed refrigerated chamber to accommodate the drive components. Further, due to the variety and number of components employed in such thermoelectric drive units, the construction of prior art thermoelectric refrigerator drive units has been relatively expensive and the drive units have been priced accordingly. These problems, and others, have resulted in thermoelectric refrigeration systems only being employed in a small percentage of systems and the environments for which the present inventor believes they are otherwise well suited.

SUMMARY OF THE INVENTION

It is an object of the present invention to provide a novel thermoelectric refrigerator drive assembly which obviates or mitigates at least one of the disadvantages of the prior art.

According to a first aspect of the present invention, there is provided a thermoelectric refrigeration drive assembly, comprising:

at least one thermoelectric heat transfer device having first and second active surfaces;

a collector member in thermal contact with said first active surface;

a transfer member in thermal contact with said second active surface and forming a portion of a vessel to contain a cooling fluid and thermally contacting fluid in said vessel;

insulation means to inhibit heat transfer between said collector member and said transfer member other than through said thermoelectric heat transfer device and wherein upon application of a suitable dc current to said thermoelectric heat transfer device heat energy is transferred from said collector member and its surroundings to said transfer member and to said cooling fluid.

Preferably, the collector is in the form of a plate which includes fins or other means to increase the exposed surface area of the collector member, and thus the thermal transfer surface, to thereby enhance the heat transfer between the surroundings of the collector member and the collector member. Also preferably, the transfer member is in the form of a plate which includes fins or other means which extend into the vessel to thereby enhance heat transfer between the transfer member and the cooling fluid.

Preferably, the cooling fluid is circulated between the vessel and a remotely located fluid to air heat exchanger. Also preferably, the circulation of the cooling fluid is enhanced by a thermostatically controlled pump. Also preferably, a thermostatically controlled fan is provided for forced air cooling of said fluid to air heat exchanger to enhance the exchange of heat therein.

Preferably, the supply of dc current to the thermoelectric heat transfer device is controlled by a control means. Also preferably, the control means is thermally connected to the transfer plate to transfer waster heat energy produced in the control means to the transfer plate. Also preferably, the control means controls the thermostatically controlled pump and/or fan.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
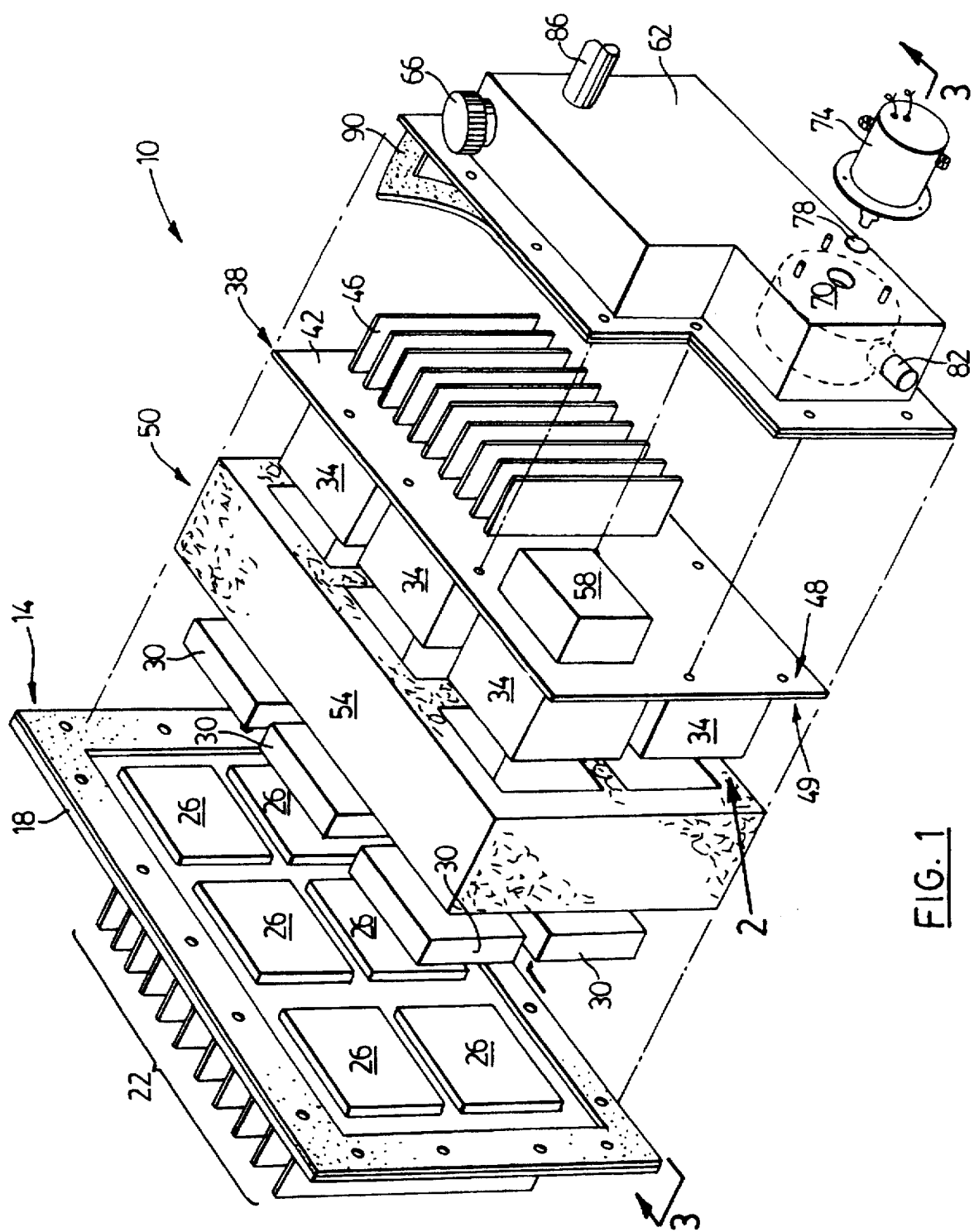
FIG. 1 shows an exploded perspective view of a thermoelectric refrigeration drive assembly in accordance with an embodiment of the present invention.

A thermoelectric refrigeration drive assembly in accordance with the present invention is indicated generally at 10 in FIG. 1. Drive assembly 10 includes a collector member 14 which, in this embodiment, is in the form of a plate 18 with a plurality of upstanding fins 22 on one face of the plate and six upraised contact regions 26 on the opposite face of the plate. The construction of collector member 14 is not particularly constrained and fins 22 and contact regions 26 may be integrally formed with plate 18, or either or both may be affixed to plate 18 as a subsequent manufacturing step provided only that good thermal connections be maintained therebetween. It is contemplated that plate 18, fins 22 and contact regions 26 can be fabricated from thermally conductive material such as aluminum or a suitable thermally transmissive plastic material. It will be understood that plate 18, fins 22, and contact regions 26 need not be formed of the same material provided that the above-described thermal connections are established therebetween.

Each contact region 26 is sized and shaped to substantially correspond to the surface area of an active surface of a respective thermoelectric heat transfer device 30, against which contact area 26 abuts when assembly 10 is fabricated. As mentioned above, thermoelectric heat transfer devices 30 are Peltier Effect devices and can, for example, be those devices marketed by Tellurex, 1248 Hastings, Traverse City, Mich., under part number CZ10-127-1.27.

The opposite active surface of each thermoelectric heat transfer device 30 abuts a second contact region 34 which is thermally connected to a transfer member 38. As with contact regions 26, each second contact region 34 includes a surface of substantially the same size and shape to correspond to the surface area of the second active surface of a respective thermoelectric heat transfer device 30.

Figure 2:
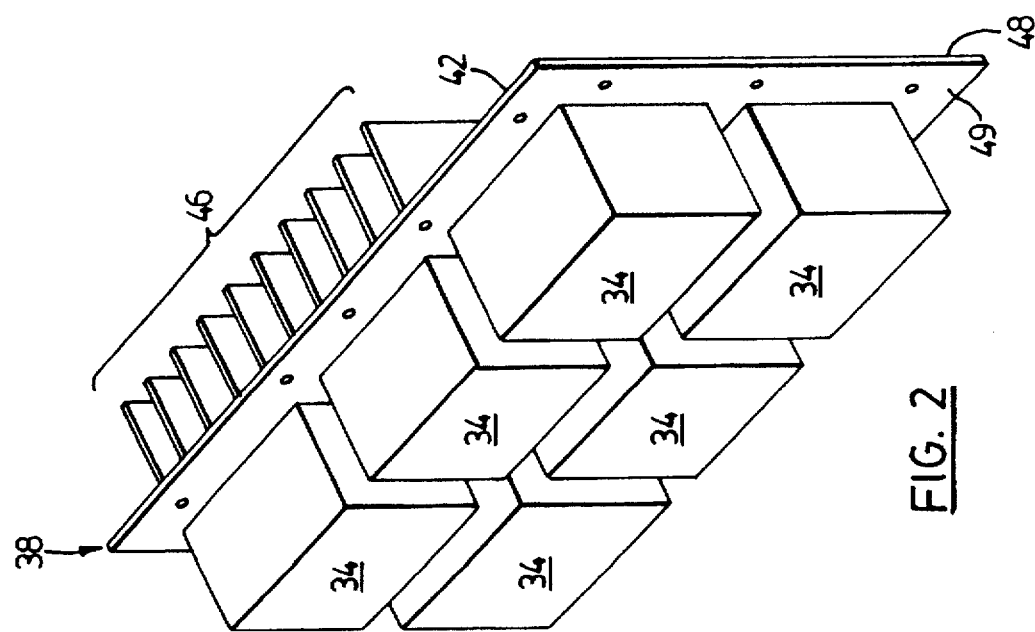
FIG. 2 shows a view of a transfer plate employed in the embodiment of FIG. 1, taken in the direction of the arrow 2 in FIG. 1.

As shown in FIGS. 1 and 2, second contact regions 34 are in thermal connection with a transfer member 38. In this embodiment, transfer member 38 is in the form of a plate 42 with a series of upstanding fins 46 on a first side 48 opposite the second side 49 to which second contact areas 34 are connected. Transfer member 38 is also formed of heat conducting material, such as aluminum or heat transmissive plastic and, as with collector member 14, the construction of transfer member 38 is not particularly constrained and fins 46 and second contact regions 34 may be integrally formed with plate 42, or either or both may be affixed to plate 42 as a subsequent manufacturing step provided only that good thermal connections be maintained therebetween. It will be understood that plate 42, fins 46, and second contact regions 34 need not be formed of the same material provided that the above-described thermal connections are established therebetween.

Insulation means 50 is provided to prevent undesired heat transfer between transfer member 38 and collector member 14. Insulation means 50 can be any suitable material with the desired thermal insulating characteristics. In particular, in the embodiment shown in FIG. 1, insulation means 50 comprises a block 54 of high density polyurethane foam which has been injected into the cavity formed between transfer member 38 and collector member 14 when they are assembled. However, as will be apparent to those of skill in the art, insulating means 50 can be constructed of any suitable material in any suitable manner. For example, a formed Styrofoam block (not shown) may be employed which includes an array of through passages designed to receive thermoelectric heat transfer devices 30 and respective portions of contact areas 26 and second contact areas 34.

In any event, the electrical leads (not shown) which supply dc current to thermoelectric heat transfer devices 30 are preferably run from the respective heat transfer device 30, through insulating means 50, to a control means 58 which is mounted to first side 48 of transfer member 38, as described below in more detail.

A storage tank for storing a supply of cooling fluid, such as a cooling fluid vessel 62, includes an open side which is adapted to sealingly engage at least a portion of first side 48 of transfer member 38. Specifically, cooling fluid vessel is joined to first side 48 of transfer member 38 such that fins 46 extend into the interior of cooling fluid vessel 62. Cooling fluid vessel 62 further includes a cooling fluid inlet 66, with a suitable cap, and a pump impeller housing 70, which in a preferred embodiment is located within cooling fluid vessel 62. The pump impeller (not shown) in housing 70 is a conventional impeller and is driven by a drive means 74 which is mounted to the outer surface of vessel 62 via an O-ring seal 78 and the outlet port 82 of pump impeller housing 70 extends through the side wall of vessel 62. A fluid return port 86 is also provided.

Preferably, vessel 62 is formed of lightweight plastic, such as polyethylene or PVC material and is integrally formed with pump impeller housing 70. Also preferably, drive means 74 is a dc motor which is controlled by control means 58, as described below in more detail. It should be noted that when assembly 10 is operating, the noise produced by drive means 74 and, to a very limited extent, the noise created by the cooling fluid moving in vessel 62 are the only operating noises produced. Thus, by selecting an appropriately quiet drive means 74 operation of assembly 10 can be advantageously quiet.

If desired, a circulating fan (not shown) may be provided in the insulated chamber in which collector 14 is mounted to enhance the transfer of heat between collector member 14 and its surroundings. In such a case, the operation of the circulating fan can be controlled by control means 58, as is described below in more detail.

Figure 3:
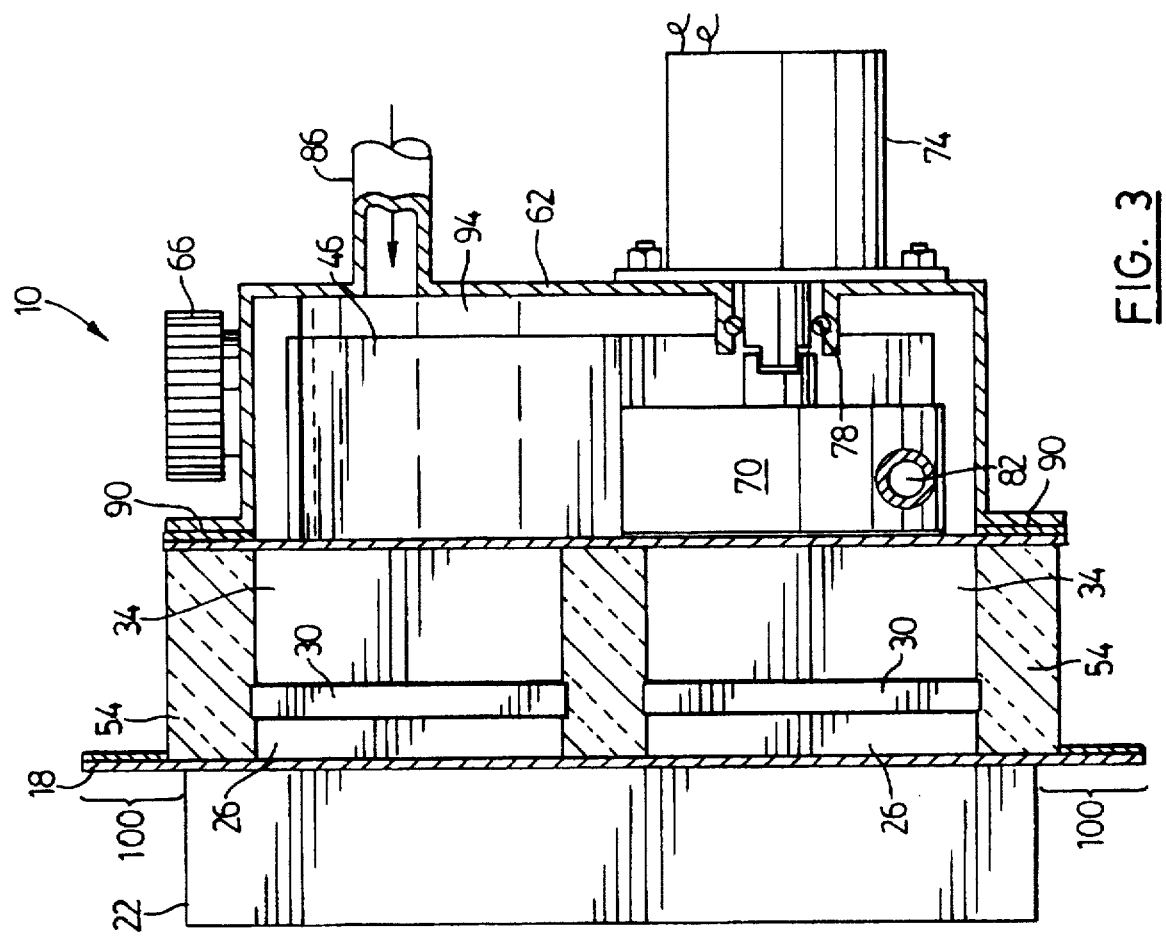
FIG. 3 shows a section of the refrigeration drive assembly of FIG. 1 taken along line 3—3 in FIG. 1.

FIG. 3 shows a section through assembled refrigeration drive assembly 10. As shown, a gasket 90 may be employed between vessel 62 and transfer member 38 to promote sealing therebetween. As is also shown in the Figure, fins 46 are immersed in the cooling fluid 94 in vessel 62 providing a large surface area for thermal transfer therebetween. The selection of a suitable cooling fluid for use in drive assembly 10 is not particularly limited, although it is contemplated that a glycol-water mixture, or other environment-friendly mixture, will be employed in many circumstances.

As will be apparent, collector member 14 includes a flange 100 which extends beyond insulating block 54 to allow assembly 10 to be simply attached to a wall in an insulated chamber with screws or bolts, etc. It will also be apparent that the profile of drive assembly 10 is such that installation merely requires providing an appropriately sized hole in a wall of the insulated chamber into which drive assembly 10 is inserted and mounted, via flange 100. This is believed to be particularly advantageous in circumstances wherein access to the exterior of an insulated chamber is restricted as drive assembly 10 may be relatively easily removed and/or installed from within the insulated chamber.

As will be further apparent to those of skill in the art, drive assembly 10 is quite compact, making relatively efficient use of the occupied volume and it is contemplated that this efficient use of space, in combination with the ease of installation via flange 100, will allow assembly 10 to be easily employed in a wide variety of uses, including recreational vehicles and/or limousines, marine vessels, ambulances, delivery vehicles, etc. It is also contemplated that assembly 10 may be employed in residential and/or other stationary uses where the compact size and low operating noise of assembly 10 will be advantageous.

Figure 4:
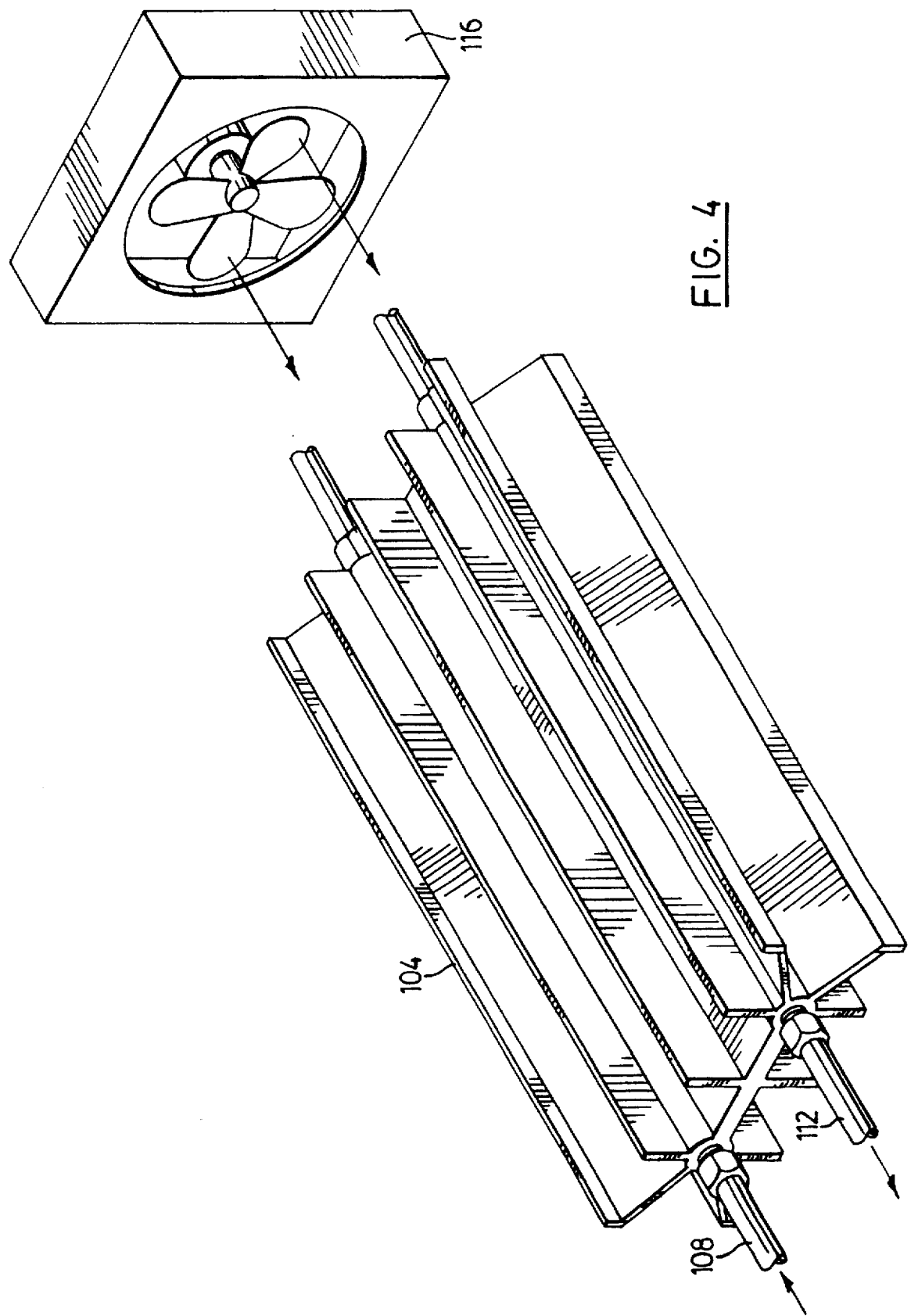
FIG. 4 shows a fluid to air heat exchanger and an optional forced air fan.

In many uses, such as use in recreational vehicles or limousines, cooling fluid 94 will be circulated to an fluid to air heat exchanger, such as that shown at 104 in FIG. 4. As shown, cooling fluid 92 from pump outlet port 82 enters fluid to air heat exchanger 104 via an appropriate conduit 108 and returns to fluid return port 86 via conduit 112. Conduits 108 and 112 can be copper, plastic or any other suitable tubing as will occur to those of skill in the art.

Fluid to air heat exchanger 104 can be any suitable heat exchanger as will be apparent to those of skill in the art. In FIG. 4, heat exchanger 104 is shown as an aluminum extrusion comprising a pair of fluid passages with a series of cooling fins extending therefrom. Depending upon the amount of heat rejection required at fluid to air heat exchanger 104, it is contemplated that two or more of the illustrated extrusions can be appropriately ganged together, either in series or in parallel, to provide the desired heat rejection capacity. It is further contemplated that in some environments, such as when used in marine vessels, a fluid to fluid heat exchanger will be used instead of fluid to air heat exchanger 104.

If desired, an optional fan 116 can be provided to supply an airflow over fluid to air heat exchanger 104 to enhance the heat rejection there through. In such cases, it is contemplated that fan 116 will be operated under the control of control means 58, as discussed in more detail below or via a thermostat which measures the temperature of the cooling fluid in conduit 112. The location of heat exchanger 104 and fan 116, if present, is not particularly limited provided that an adequate air supply can circulate past heat exchanger 104, with or without assistance from fan 116, and that conduits 108 and 112 can be connected between heat exchanger 104 and pump outlet port 82 and fluid return port 86 on assembly 10.

Figure 5:
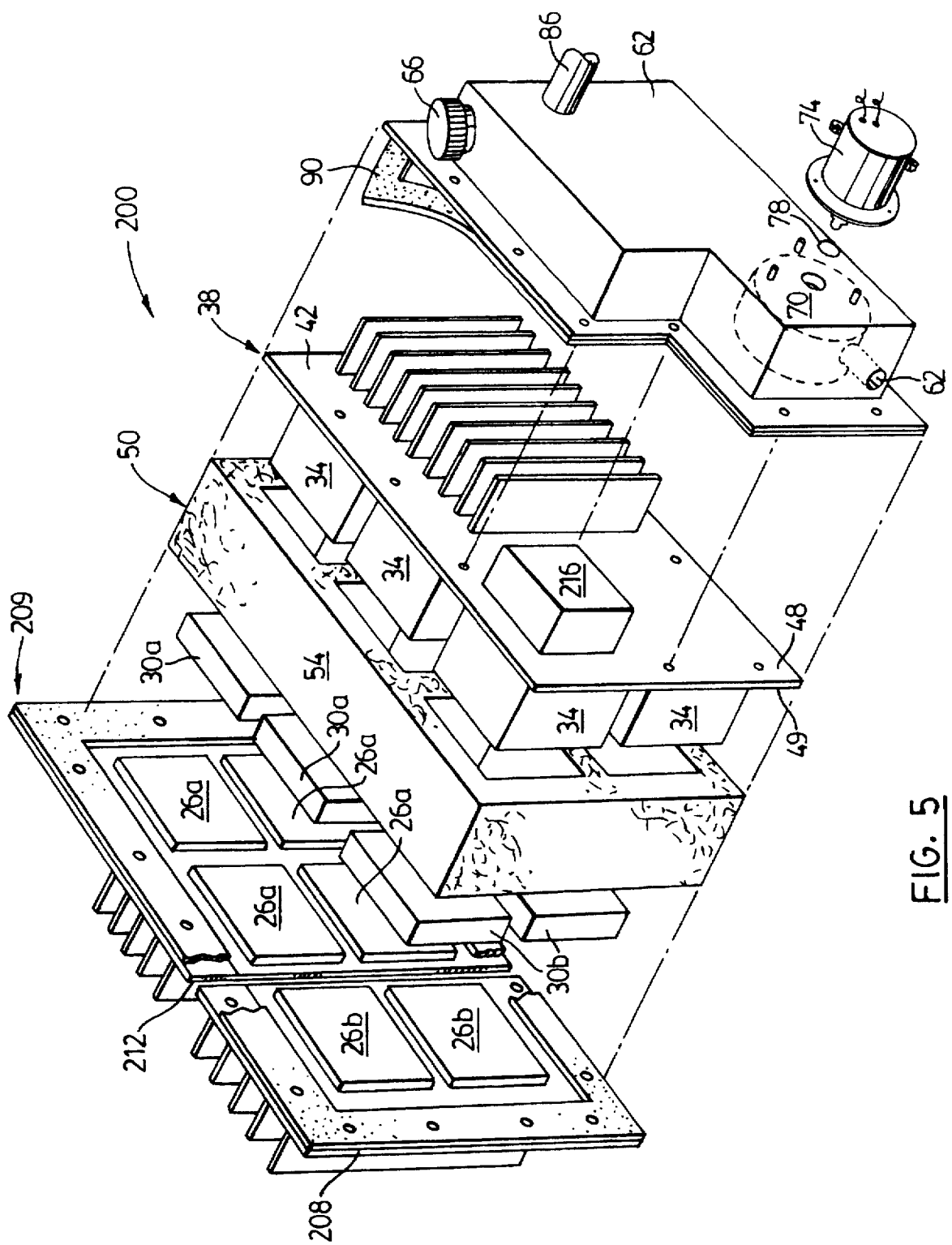
FIG. 5 shows an exploded perspective view of another embodiment of a thermoelectric refrigeration drive assembly in accordance with the present invention.

FIG. 5 shows a refrigeration drive assembly 200 in accordance with another embodiment of the present invention wherein like components to those in FIGS. 1, 2 and 3 are identified with the same reference numerals. In this embodiment, two collector members 204 and 208 are provided, each of which is spaced from the other by a small gap 212 into which an insulating material, such as silicone rubber, is placed.

As can be seen in the Figure, collector members 204 and 208 are similar to collector member 14 of FIG. 1, except for the size of collector members 204 and 208 which, when combined, occupy the area of collector member 14. Along with the reduced size of collector members 204 and 208, each has a reduced number of contact regions 26 from those of collector member 14. Specifically, collector member 204 has four contact regions 26a while collector member 208 has two contact regions 26b. Of the six thermoelectric heat transfer devices 30, the first active surface of each of four devices 30a thermally connects to the respective contact region 26a of collector member 204 while the first active surface of each of two devices 30b thermally connects to the respective contact region 26b of collector member 208. The remainder of assembly 200 is substantially the same as that of assembly 10 with the exception of control means 216 which is further discussed below.

As will be apparent to those of skill in the art, the configuration of assembly 200 allows for an unequal distribution and/or separate control of heat transfer capacity in assembly 200 between collector members 204 and 208. Accordingly, assembly 200 is intended to be placed into an insulated chamber with two adjacent compartments, one of which has collector member 204 mounted in one of its walls and the other of which has collector member 208 mounted in one of its walls. Collector member 204 has a greater heat transfer capacity than does collector member 208 and thus the compartment in which collector member 204 is mounted can be a 'quick freeze' or freezer compartment while the compartment in which collector member 208 is mounted can be a refrigerated compartment.

As will be apparent to those of skill in the art, various other configurations of collector members are possible, but a contemplated advantage of the present invention is that such different configurations can be obtained without requiring the components of the remainder of assembly 200 to be modified, unless the number of devices 30 is changed. Even in this latter case, depending upon the number of devices 30 employed, it may only be required to change transfer member 38 to accommodate more devices 30 and, if fewer devices 30 are to be employed, they may simply be omitted from assembly 10 or 200 and the volume between the unused contact regions 26 and unused second contact regions 34 filled with insulating material 54.

Assembly 200 can also provide equal heat transfer capacity in collector members 204 and 208 (i.e.—each collector member being in thermal contact with the first active surface of the same number of thermoelectric devices). In such a case, the collectors can be mounted in separate compartments which are maintained at different, but similar, temperatures. This can be useful, for example, in an ambulance wherein blood products can be stored in a compartment maintained at one temperature by collector member 204 and pharmaceuticals can be stored in a compartment maintained at a different temperature by collector member 208.

In any case, it will be understood that the present invention is not limited to drive assemblies with six thermoelectric heat transfer devices 30 and that more or fewer devices 30 may be employed as required with each collector member being thermally connected to more or fewer devices 30 as appropriate.

Figure 6:
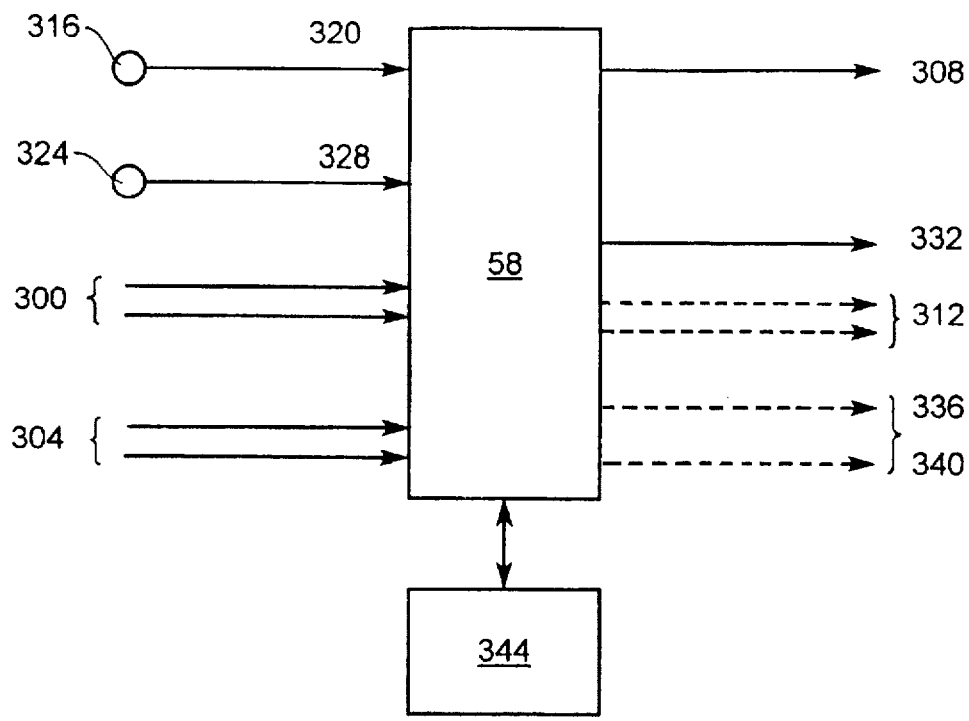
FIG. 6 shows a block diagram of an embodiment of a control means for use with the present invention.

FIG. 6 shows control means 58 which operates refrigerator drive assembly 10. In a presently preferred embodiment of the instant invention, control means 58 can operate drive assembly 10 from either AC power, applied at 300 or DC power applied at 304. It is contemplated that AC power may be supplied at voltages from between 95 to 260 volts and at frequencies of 50 or 60 Hz to accommodate ac power standards in most countries of the world. It is also contemplated that DC power may be applied at 12 or 24 volts.

As is known by those of skill in the art, thermoelectric heat transfer devices 30 require dc power at relatively low voltage and at relatively high currents. Accordingly, controller 58 includes an invertor (not shown) to convert dc power supplied at 304 into ac power. The ac power produced by this invertor, or the ac power supplied at 300, is then converted to dc power by a convertor (not shown) at the desired voltage for output, at 308, to thermoelectric heat transfer devices 30. When controller 58 is supplied with dc power at 304, the ac power produced by the invertor can also be supplied at output 312 for other uses, as may be desired. For example, it is contemplated that when used in recreation vehicles or marine vessels powered from batteries, the provision of ac power output 312 can be used to operate small appliances, etc. Of course, the voltage and frequency of ac power at output 312 may be selected as required by the user.

A thermistor 316 is located in the insulated chamber in which drive assembly 10 is installed and provides an input 320 to control means 58 representative of the temperature in the insulated chamber. Another thermistor 324 is located in cooling fluid vessel 62 and provides an input 328 to control means 58 which is representative of the temperature of the cooling fluid in vessel 62.

Control means 58 is responsive to input 320 to appropriately vary the dc power supplied at 308 to thermoelectric heat transfer devices 30 appropriately. Control means 58 is also responsive to input 328 to supply dc power to output 332 which is connected appropriately to drive means 74 of the cooling fluid pump in vessel 62. If fan 116 is provided, control means 58 provides suitable power at output 336 to run fan 116 as required. An additional power output 340 can be provided for a circulating fan in the insulated chamber, if such a fan is present.

The activation and operation of control means 58 is provided via a suitable control panel 344 which includes means to specify a desired final temperature for the insulated chamber and one or more output indicators to monitor operation of drive assembly 10. The design and construction of control means 58 is not particularly limited and a variety of suitable designs will occur to those of skill in the art.

While control means 58 is presently preferred, it will be apparent to those of skill in the art that in some circumstances a simpler control device may be employed. For example, it is contemplated that drive assembly 10 can be configured to provide maximum cooling at all times and in this case, the above-mentioned thermistors can be omitted as drive assembly 10 will be operated continuously. In other circumstances, the heat load to be rejected may be known and thus a simple timer can be employed to operate drive assembly 10 for an appropriate predetermined duty cycle. Other configurations and combinations will occur to those of skill in the art.

As shown in FIG. 1, control means 58 is mounted to first side 48 of transfer member 38 in a thermally conductive manner such that waster heat produced by control means 58 is transferred to transfer member 38 and then to cooling fluid in vessel 62. While operation of the power invertor and convertor in control means 58 can produce relatively significant amounts of waste heat, the necessity of providing large heat sink fins and/or a cooling fan for control means 58 is avoided by employing the same heat rejection capability for control means 58 as for the rest of drive assembly 10, namely transfer member 38 and the cooling fluid and fluid to air heat exchanger 104. In addition to reducing the number of components required in drive assembly 10, this also results in a compact overall size for drive assembly 10.

Figure 7:
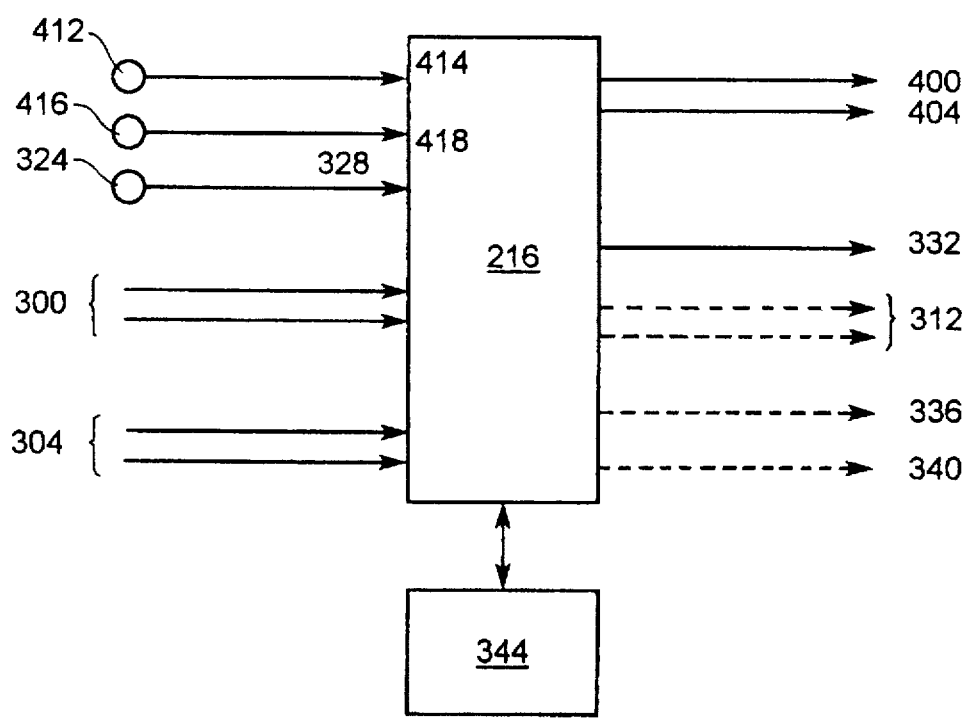
FIG. 7 shows a block diagram of another embodiment of a control means for use with the present invention.

FIG. 7 shows control means 216 which operates assembly 200. Control means 216 differs from control means 58 described above in that at least two power outputs 400 and 404 are provided for thermoelectric heat transfer devices 30. Specifically, power output 400 is connected to the thermoelectric heat transfer devices 30a which are thermally connected to collector member 204 and power output 404 is connected to the thermoelectric heat transfer devices 30b which are thermally connected to collector member 208. Further, a thermistor 412 provides an input 414 to control means 216 which is representative of the temperature in the container in which collector member 204 is mounted while a thermistor 416 provides an input 418 to control means 216 which is representative of the temperature in the container in which collector member 208 is mounted. Each of power outputs 400 and 404 is separately controllable by control means 216 in response to respective inputs from thermistors 412 and 416.

The design and construction of control means 216 is not particularly limited and a variety of suitable designs will occur to those of skill in the art. In fact, it is contemplated that for economy and convenience a single control device can be designed and manufactured for use as control means 58 and control means 216 with the appropriate inputs and outputs being employed as required.

The present invention provides a novel refrigerator drive assembly which is compact and which may be employed in a wide variety of environments. Further, it is contemplated that the number and/or complexity of the components required to construct a refrigerator drive assembly in accordance with the present invention is reduced, providing for reduced manufacturing costs.

The above-described embodiments of the invention are intended to be examples of the present invention and alterations and modifications may be effected thereto, by those of skill in the art, without departing from the scope of the invention which is defined solely by the claims appended hereto.

We claim:

1. A thermoelectric refrigeration drive assembly, comprising:
    at least one thermoelectric heat transfer device having first and second active surfaces;
    a collector member in thermal contact with said first active surface of said at least one thermoelectric heat transfer device;
    a heat exchanger for rejecting heat from a cooling fluid;
    a storage tank for storing a supply of cooling fluid for said heat exchanger, said storage tank being sized to contain a supply of cooling fluid in excess of that required to fill said heat exchanger;
    a transfer member comprising at least a portion of said storage tank and being in thermal contact with said second active surface of each said at least one heat transfer device and thermally contacting said cooling fluid in said storage tank;
    insulation means to inhibit heat transfer between said collector member and said transfer member other than through said thermoelectric heat transfer device and wherein upon application of a suitable dc current to said thermoelectric heat transfer device heat energy is transferred from said collector member and its surroundings through said at least one heat transfer device to said cooling fluid through said transfer member and from said cooling fluid to said heat exchanger.

2. An assembly according to claim 1 wherein said collector member comprises a plate with first and second sides, said first side in thermal contact with said first active surface of said at least one heat transfer device and said second side including means to increase the thermal transfer surface thereof.

3. An assembly according to claim 2 wherein said means to increase the thermal transfer surface comprises a plurality of upstanding fins.

4. An assembly according to claim 2 wherein said transfer member comprises a plate with first and second sides, said first side in thermal contact with said second active surface of each said at least one heat transfer devices and said second side including means to increase the thermal transfer surface thereof.

5. An assembly according to claim 4 wherein said means to increase the thermal transfer surface comprises a plurality of upstanding fins which extend into the interior of said storage tank for storing a supply of cooling fluid.

6. An assembly according to claim 1 wherein said heat exchanger is a fluid to air heat exchanger.

7. An assembly according to claim 1 further comprising a pump to circulate cooling fluid between said storage tank for storing a supply of cooling fluid and said heat exchanger.

8. An assembly according to claim 1 further comprising a control means responsive to the temperature adjacent said collector member to control application of said suitable dc current to said at least one thermoelectric heat transfer device.

9. An assembly according to claim 8 further comprising a pump to circulate cooling fluid between said storage tank for storing a supply of cooling fluid and said heat exchanger and wherein said control means is responsive to the temperature of cooling fluid in said storage tank to control operation of said pump.

10. An assembly according to claim 9 wherein said heat exchanger is a fluid to air heat exchanger and further comprising a fan to supply an airflow to said fluid to air heat exchanger.

11. An assembly according to claim 10 wherein said control means is responsive to the temperature of cooling fluid in said storage tank to control operation of said fan.

12. An assembly according to claim 8 wherein said control means is in thermal contact with said transfer member.

13. An assembly according to claim 1 comprising at least two thermoelectric devices and at least two collector members, each of said at least two collector members being in thermal contact with the first active surface of a different one of said at least two thermoelectric devices.

14. An assembly according to claim 13 wherein each of said at least two collector members comprises a plate with first and second sides, said first side of each of said at least two collector members in thermal contact with said first active surface of said different one of said at least two thermoelectric devices and each said second side including means to increase the thermal transfer surface thereof.

15. An assembly according to claim 13 comprising a plurality of thermoelectric devices wherein each of said at least two collector members is in thermal contact with the first active surfaces of a different number of said plurality of thermoelectric devices such that each said collector member has a different heat transfer capacity.

* * * * *